(12) United States Patent
Pickerd et al.

(10) Patent No.: US 6,892,150 B2
(45) Date of Patent: May 10, 2005

(54) COMBINED ANALOG AND DSP TRIGGER SYSTEM FOR A DIGITAL STORAGE OSCILLOSCOPE

(75) Inventors: John J. Pickerd, Hillsboro, OR (US); Que Thuy Tran, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/155,381

(22) Filed: May 24, 2002

(65) Prior Publication Data

US 2003/0220753 A1 Nov. 27, 2003

(51) Int. Cl.[7] .............................................. G01R 13/02
(52) U.S. Cl. .............................. 702/67; 702/66; 702/69
(58) Field of Search ............................... 702/80, 66–71, 702/73–76, 79, 117, 118, 124–127, 180, 176–178, 187, 189, FOR 103, FOR 104, FOR 110, FOR 134, FOR 111, FOR 159, FOR 170, FOR 171; 345/440.1, 440, 970; 324/76.15, 76.24, 76.38, 76.42

(56) References Cited

U.S. PATENT DOCUMENTS

| | | | | |
|---|---|---|---|---|
| 5,123,034 A | * | 6/1992 | Grujon | 377/19 |
| 5,255,365 A | | 10/1993 | Hungerbuhler | 345/440.1 |
| 5,841,286 A | * | 11/1998 | Stoops | 324/511 |
| 5,929,838 A | * | 7/1999 | Hall | 345/440.1 |
| 5,978,742 A | * | 11/1999 | Pickerd | 702/66 |
| 5,986,637 A | * | 11/1999 | Etheridge et al. | 345/596 |
| 5,999,163 A | * | 12/1999 | Ivers et al. | 345/208 |
| 6,151,010 A | | 11/2000 | Miller et al. | 345/440.1 |
| 6,195,617 B1 | | 2/2001 | Miller | 706/12 J |
| 6,584,419 B1 | * | 6/2003 | Alexander | 702/68 |
| 2001/0001850 A1 | | 5/2001 | Miller | 702/67 |

FOREIGN PATENT DOCUMENTS

EP             1156338 A2  *  11/2001    ........... G01R/13/34

* cited by examiner

*Primary Examiner*—Hal Wachsman
(74) *Attorney, Agent, or Firm*—Thomas F. Lenihan; Francis I. Gray

(57) ABSTRACT

A combined analog and DSP trigger system for a digital storage oscilloscope (DSO) enables the DSO to real-time trigger on events in an input analog signal based on traditional trigger events in the input analog signal and/or predetermined anomalous events detected in digitized samples of the input analog signal. A processor receives the digitized samples at the input of an acquisition memory to detect the anomalous events and provides an event detect signal to the trigger system. Predetermined amounts of the digitized samples around the events are acquired in an acquisition memory for further processing and display.

13 Claims, 9 Drawing Sheets

US 6,892,150 B2

COMBINED ANALOG AND DSP TRIGGER SYSTEM FOR A DIGITAL STORAGE OSCILLOSCOPE

FIELD OF THE INVENTION

The subject invention concerns, in general, the field of Digital Storage Oscilloscopes (DSOs), and concerns in particular, an architecture for DSOs that provides improved digital signal processing of waveform data.

BACKGROUND OF THE INVENTION

The long-record-length features of modern long-record-length oscilloscopes are generally found to be very difficult and cumbersome to control. That is, when one has collected 32 Mbytes per channel of data in such a deep memory oscilloscope, how does one then use and interpret that data? For example, assume that the user wanted to scroll through the entire record looking for a particular event that caused a problem in the system under test. For such a visual scan, a scrolling-rate of about 500 points per second is quite reasonable. That is, a particular point on waveform would move across the screen from right to left in about 1.0 second. Unfortunately, at this rate it would take approximately 17.5 hours for the user to view the entire data record.

The fact that many oscilloscopes include a printer might lead one to think that the solution to this problem would be to merely print out the entire record. For such a print out, a resolution of 300 points per inch is quite reasonable. Unfortunately, if the user were to print out such a long record on paper at 300 points per inch (approximately 118 points per cm), the printer would use 1.684 miles (2.6944 km) of paper. These two examples highlight the difficulty in dealing with large amounts of data. It simply is not practical for the user to visually inspect all of the collected data for the anomalies that the user must find.

Modern DSOs attempt to solve this problem by waiting for a trigger event to occur, and then acquiring in memory a frame of waveform data surrounding the event. The frame is then processed by waveform math software, measurement software, and display system software. All of this post-processing creates extremely long periods of "dead time", in which the DSO is incapable of acquiring and storing additional waveform samples. As a result, the anomaly that the user is searching for may occur, and be missed.

More recent DSOs have attempted to reduce the "dead time" by physically positioning Digital Signal Processing (DSP) ICs close to the acquisition memory to convert acquired waveform data to display data more efficiently. This arrangement is sometimes referred to as a "FastAcq" mode of operation. Use of FastAcq circuitry has greatly reduced the "dead time" between triggers, and increased the number of samples per second that are displayed. Unfortunately, the data frames processed by the FastAcq circuitry are not retained, and are therefore unavailable for additional processing. Moreover, cycle-to-cycle measurements (for jitter measurement) are adversely affected by the use of FastAcq circuitry because the time relationship between successive triggers is not maintained.

Another disadvantage of many current DSO architectures is a "bottleneck" that exists because they transfer all of the data from acquisition memory to main memory for processing and display over a relatively slow (i.e., typically 30 Mb/sec.) data bus.

In order to process this transfer-rate issue, Agilent Technologies, Inc. of Palo Alto, Calif., has recently introduced Infiniium MegaZoom deep-memory oscilloscopes employing a custom ASIC that optimizes the sample rate for a given sweep speed and sends only the waveform data needed for a particular front panel setting. The Infiniium MegaZoom oscilloscopes provides a waveform update rate that is approximately twenty-five times greater than conventional deep memory oscilloscopes.

Wavemaster™ oscilloscopes with X-Stream™ technology, manufactured by LeCroy Corporation of Chestnut Ridge, N.Y. provide an alternative solution to the transfer-rate problem. These oscilloscopes employ a silicon-germanium (SiGe) digitizer and a high-speed streaming bus to transfer data from an analog to digital converter (ADC) through an acquisition memory and into a memory cache for extraction of information by software routines.

None of the above-mentioned systems provide the solution to the problem of quickly identifying anomalies and transferring only a frame of memory surrounding the anomaly to the waveform processing and display portions of the oscilloscope.

SUMMARY OF THE INVENTION

It is herein recognized that it may not be necessary in all cases to use a long record length DSO in an effort to capture all data to search for anomalies. Instead, in some cases it may be advantageous to capture, process, and display only the data surrounding the anomalies in real time. In this regard, a digital storage oscilloscope according to the subject invention is capable of responding to its usual assortment of analog trigger signals and is also responsive in real time to an event trigger signal provided by a processor unit having an input coupled for receiving a data stream from an A/D converter. The processor unit examines the streaming digital samples of a signal under test in real time for the occurrence of a predetermined event. Upon detection of one of the predetermined events, a frame of data surrounding the event is captured for waveform processing and display. Multiple waveforms from across all active channels can be displayed simultaneously, each being captured in response to a different user-defined event. A screen display may be programmed to display a different kind of event such as Runt signal, Overshoot, or Pulsewidth Violation in each waveform, or to display multiple occurrences of the same kind of event such as Runt signal in each waveform. The oscilloscope can respond to traditional analog-type trigger signals or to detection of the predetermined anomalies, or a combination of both. The oscilloscope can be programmed to trigger on a sequence of events, or statistical data, from a histogram for example. Moreover, the oscilloscope can perform measurements continuously without generating a trigger signal at all.

DETAILED DESCRIPTION OF THE DRAWING

Figure 1:
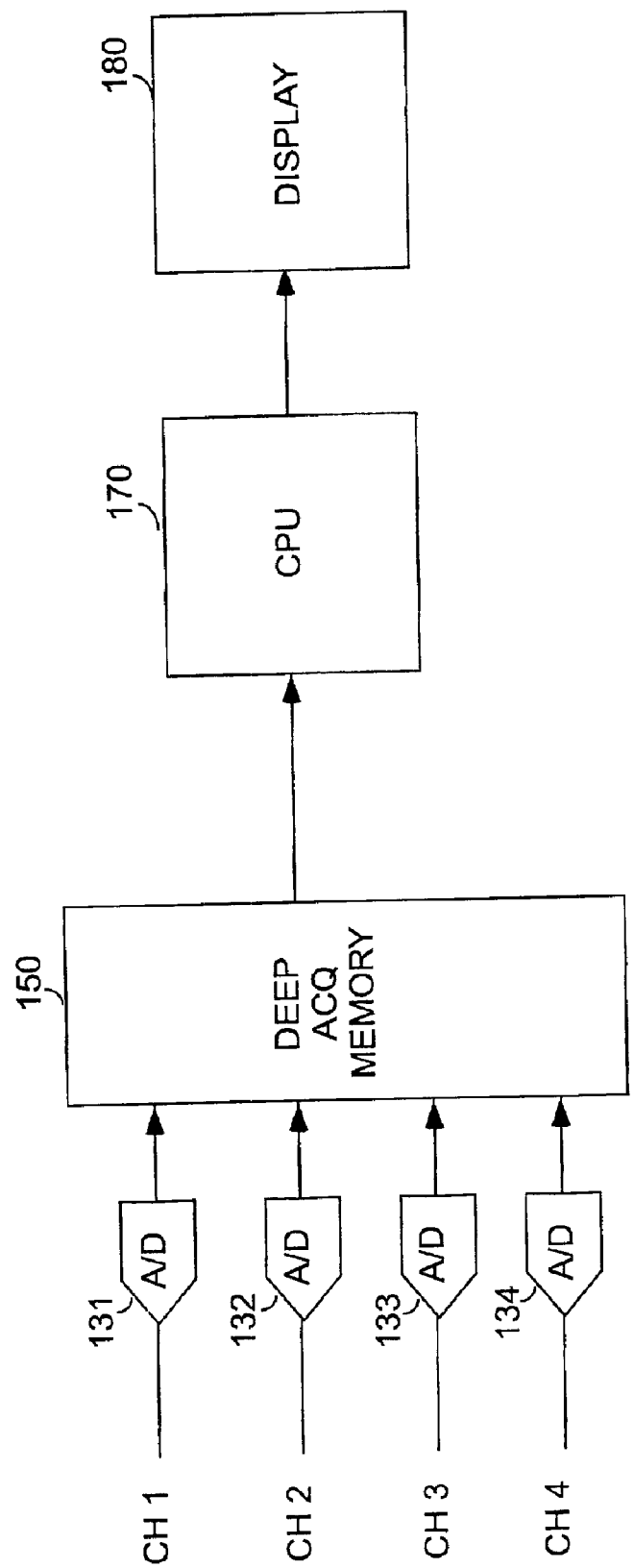
FIG. 1 is a simplified block diagram of the architecture for a conventional deep-memory digital storage oscilloscope, as known from the prior art.

FIG. 1 shows a highly simplified block diagram of a conventional four-channel deep-memory digital storage oscilloscope, as known from the prior art. Each channel has a respective analog-to-digital (A/D) converter 131, 132, 133, 134 for receiving an analog signal from a circuit under test via a probe and cable arrangement (not shown). A/D converters 131, 132, 133, 134, apply digital samples of their respective analog signal to a Deep-Acquisition Memory arrangement 150. The term "Deep-Acquisition Memory" means a memory capable of storing data records of millions of points to billions of points in length. A CPU 170 then processes all of the data of the data record for ultimate display on a display screen 180. There are two distinct problems associated with this type of architecture. First, CPU 170 forms a "bottleneck" in that it takes a significant amount of time to transfer such huge data records, resulting in dead time before another acquisition can be made. Second, CPU 170 may use an inordinate amount of computing resources to compress, for example, 32 Mpoints down to 500 points for display. Unfortunately, this expenditure of computing resources most often results in a viewable waveform that is of very little use to the operator.

Figure 2:
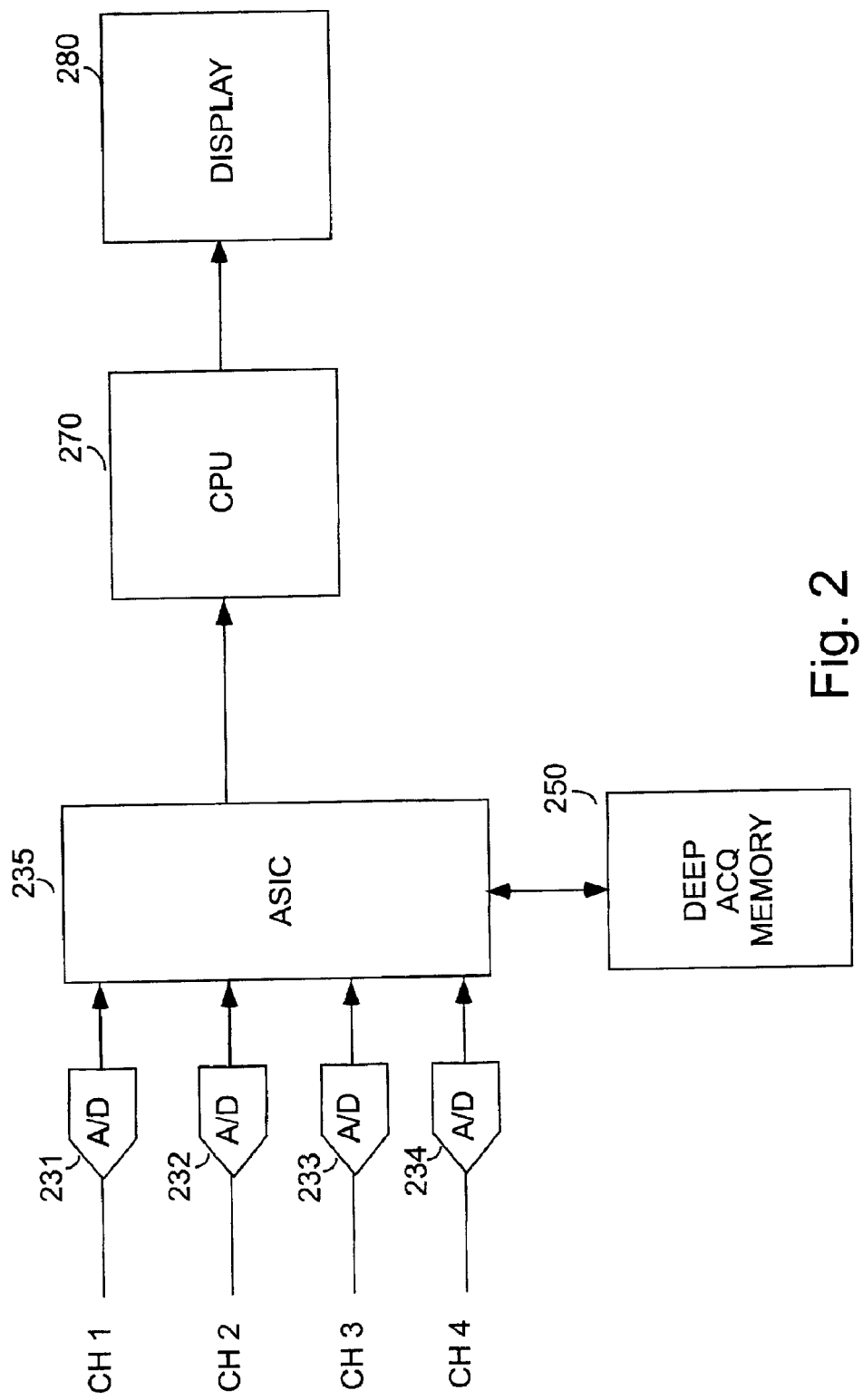
FIG. 2 is simplified block diagram of the architecture of a MegaZoom deep-memory digital storage oscilloscope, as known from the prior art.

In FIGS. 1 through 5, similarly numbered elements have similar functions which need not be described again. FIG. 2 shows a simplified block diagram of the aforementioned Agilent Technologies Infiniium oscilloscope with the Mega-Zoom feature. The MegaZoom feature employs a custom Application Specific Integrated Circuit (ASIC) 235 interposed between the A/D converters 231, 232, 233, 234 and The Deep Acquisition Memory unit 250. ASIC 235 communicates with a front panel (not shown) and optimizes the sample rate for a given sweep speed and sends to the CPU 270 only that waveform data needed for a particular front panel control setting. This operation significantly reduces the bottleneck described above, and provides for the display of a more meaningful signal.

Figure 3:
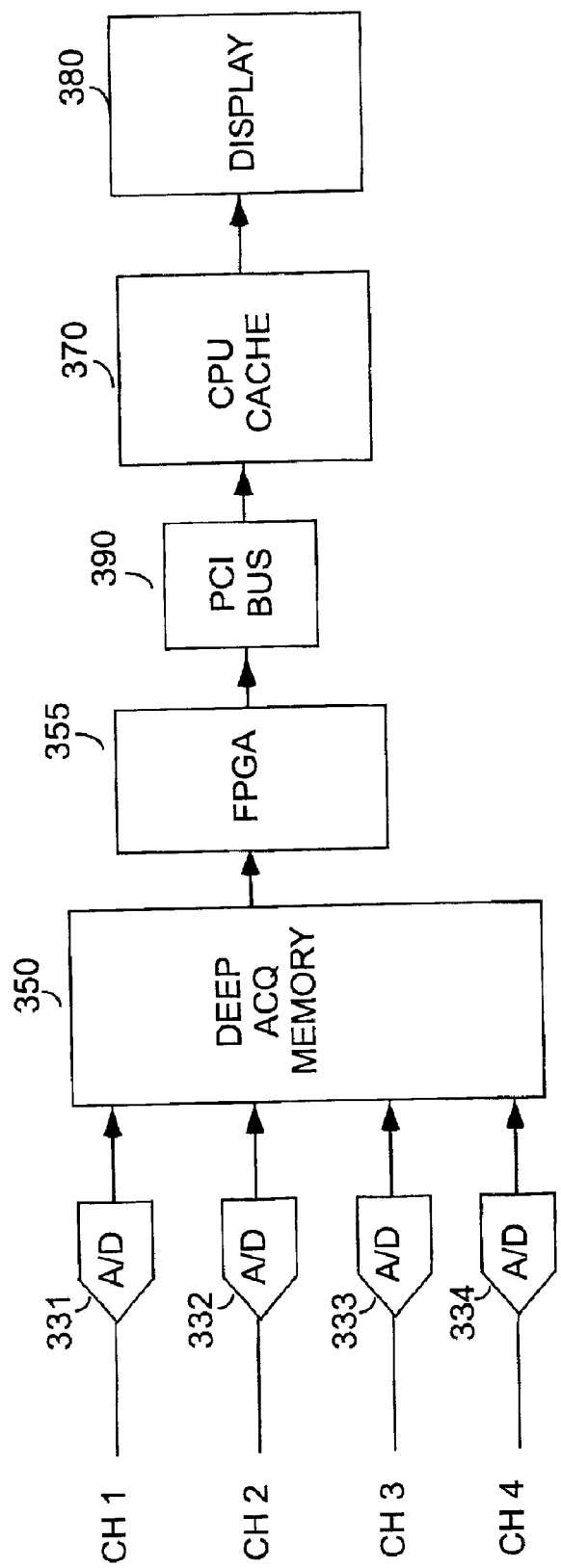
FIG. 3 shows a simplified block diagram of an acquisition architecture employing an FPGA for use in a digital storage oscilloscope, as known from the prior art.

FIG. 3 shows a highly simplified block diagram of an architecture that may be similar to that used in the above-mentioned LeCroy WaveMaster™ with X-Stream™ capability. This architecture is a significant improvement over that of FIG. 1 in terms of its ability to transfer data quickly from the acquisition system to the processing and display system. These oscilloscopes employ a silicon-germanium (SiGe) digitizer 355 which may be an FPGA and a high-speed streaming bus 390 to transfer data from an analog to digital converter (ADC) 331, 332, 333, 334 through a Deep Acquisition Memory 350 and into a Memory Cache 370 for extraction of information by software routines.

Figure 4:
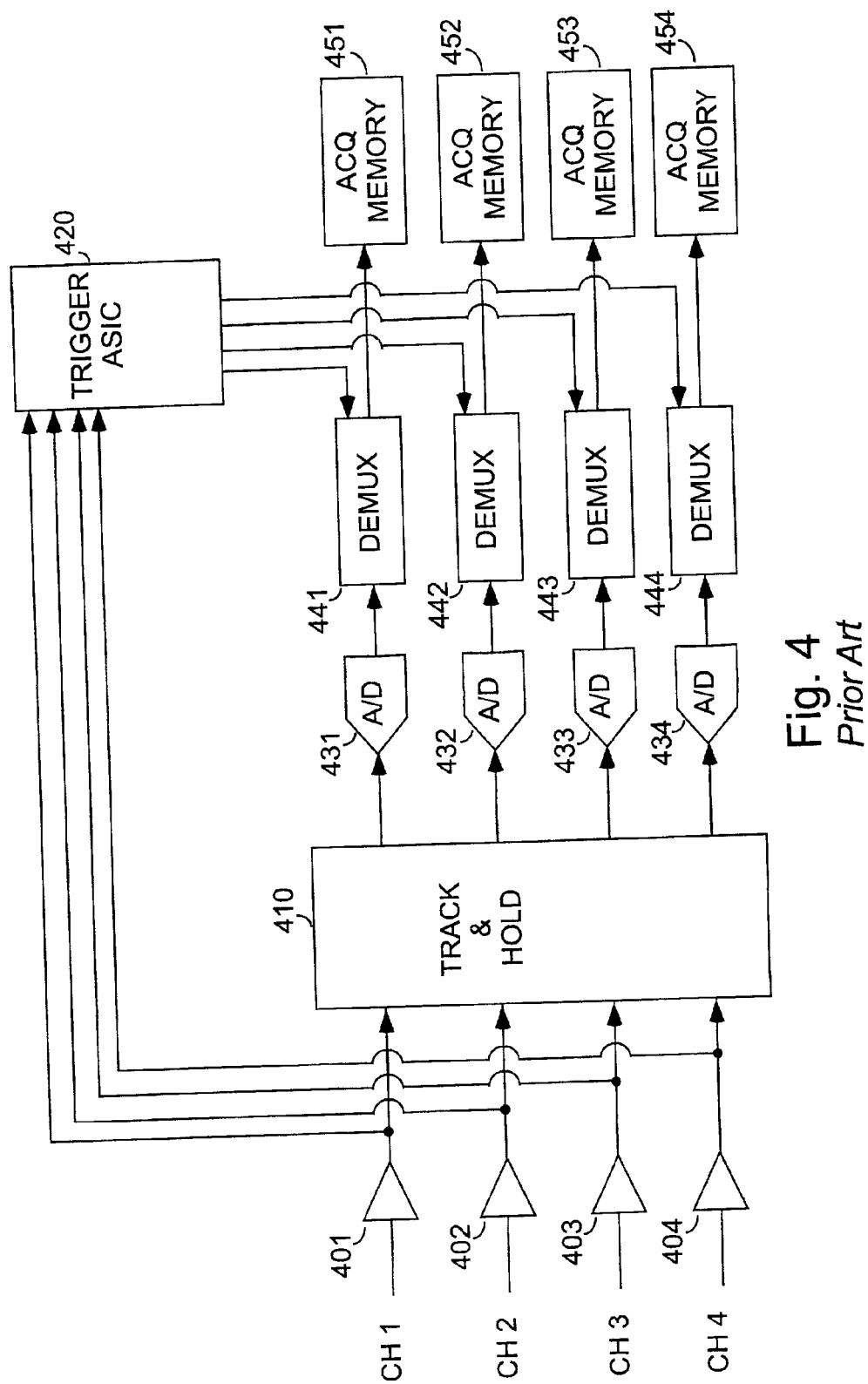
FIG. 4 shows a more detailed block diagram of the acquisition architecture of FIG. 1, as known from the prior art.

FIG. 4 is a more detailed view of the architecture of the acquisition system of a conventional deep memory oscilloscope. Referring to FIG. 4, Buffer amplifiers 401, 402, 403, 404, are associated with respective oscilloscope channels. Each of Buffer amplifiers 401, 402, 403, and 404 amplifies an analog signal applied to its input and applies the buffered signal to a Track & Hold unit 410 and to a Trigger ASIC 420. Track & Hold unit 410 is basically an analog switch used to route signals to the A/D Converters according to different interleave configurations. Track & Hold unit 410 also stabilizes the input signal and presents it to an A/D Converter 431, 432, 433, 434.

A Demultiplexer unit (DEMUX) 441, 442, 443, 444 is itself an ASIC that receives the digitized samples of the input signal from the A/D Converters 431, 432, 433, 434 and also receives trigger signals from Trigger ASIC 420. As is well known, an A/D Converter produces data samples at a rate that is faster than a memory can store them. To solve this problem, a demux is used to reduce the rate at which memory-write operations occur by temporarily accumulating a series of high-speed data samples from the A/D and then storing in memory perhaps 16 to 32 of these samples in a single memory-write operation. In this way, the memory is allowed sufficient time to store its data before being presented with the next group of newly acquired data samples. In the absence of a trigger signal, the demux ASICs continuously write data into memory. When a trigger signal is received, the demux ASICs continue to write data into memory for only as long as necessary to store the required amount of post trigger data. At that time, data storage is stopped until a signal is received indicating that the acquisition memory has been unloaded into the processing system of the oscilloscope. Thus, DEMUX 441, 442, 443, 444 controls the flow of data into Deep Acquisition Memory 451, 452, 453, 454.

Unfortunately, none of the architectures illustrated in FIGS. 1 through 4 allows a user to examine the data in real time as it is being acquired, while triggering on several different search criteria, and to observe the result in a lively and active display. An operator may realize that an anomaly is present in the signal under test and that the anomaly is causing a problem. However, he may not know what the anomaly is. How does one set up a trigger if one does not know if the anomaly is taking the form of a runt signal, or pulse width problem, or even a missing pulse? Thus, it is important to be able to trigger on different criteria to detect the "unexpected" form of the variant, by changing the triggering criteria as one continuously monitors the acquisition of the data.

Figure 5:
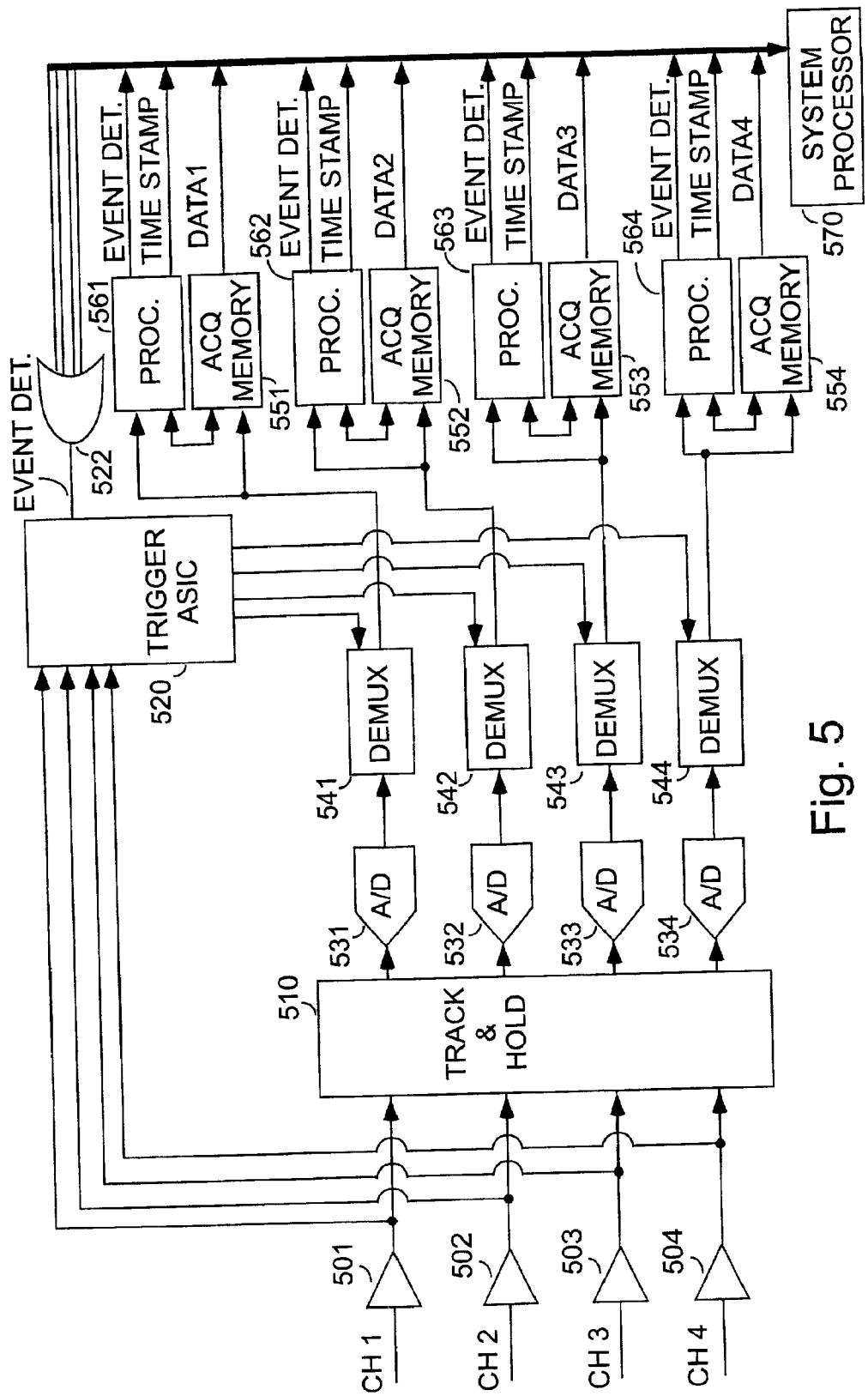
FIG. 5 shows a block diagram of an acquisition architecture employing an arrangement of a processor and an acquisition memory for use in a digital storage oscilloscope in accordance with the subject invention.

Such an oscilloscope architecture is shown in FIG. 5, and the subject invention will now be described with respect to FIGS. 5, 6 and 7. FIGS. 4 and 5 are identical with the exception of the close physical and logical association of a Processor unit (PROC.) 561, 562, 563, 564 with an Acquisition Memory 551, 552, 553, 554.

In the apparatus of FIG. 5, any or all of the channels (i.e., CH 1 through CH 4) are used to supply samples of the signal to be examined. In this regard, all of acquisition memories 551, 552, 553, and 554 may be concatenated to form a single long record length memory, or allocated to active channels. Processor unit (PROC.) 561, 562, 563, 564 may be a microcomputer, but preferably is an FPGA (Field Programmable Gate Array) because an FPGA is capable of processing data up to 100× faster than a microcomputer (i.e., up to 100× faster than an Intel Pentium IV® microcomputer). Acquisition Memory 551, 552, 553, 554 has a data path DATA1, DATA2, DATA3, DATA4 coupled to a bus leading to a System Processor 570 and ultimately to its normal wave form data processing path. Note that Processor unit 561, 562, 563, 564 also has a data output path labelled TIME STAMP, also coupled to the bus for providing to the System Processor Time Stamps defining the frames of data to be transferred for processing and display. Processor unit 561, 562, 563, 564 also provides at least one "trigger-type" signal labelled EVENT DET. (Event Detect). It is envisioned that EVENT DET. may in fact be multiple event detection signal lines coupled to System Processor 570, to Trigger ASIC 520 by way of OR-gate 522, and to external trigger output ports of the oscilloscope. Each EVENT DET. output is latched so that it can later be read to determine which trigger event caused the data frame to be processed. Processor unit 561, 562, 563, 564 may be a single processor controlling all acquisition memories, or a plurality of processors wherein each processor is associated with a portion of the acquisition memory (as shown in FIG. 5). With the illustrated arrangement of processing units in all channels, both parallel simultaneous triggering and sequential triggering within and across channels is easily accomplished. Communication lines between the Processor units 561, 562, 563, 564 are not shown for simplicity. One skilled in the art will recognize that although an OR-gate 522 is shown, any form of logic (such as an AND-gate, or an XOR-gate, or combination of logic gates) may be used as needed to implement a specific triggering function.

Some novel features of the subject invention are: (1) triggering on analog signal conditions, digital signal events, or a combination of both, (2) triggering on statistics derived from histograms of anomalous events, (3) triggering on a sequence of multiple events within a single channel or across channels in real time; and (4) triggering on logical combinations of triggers and events within a single channel or across channels in real time.

Figure 6:
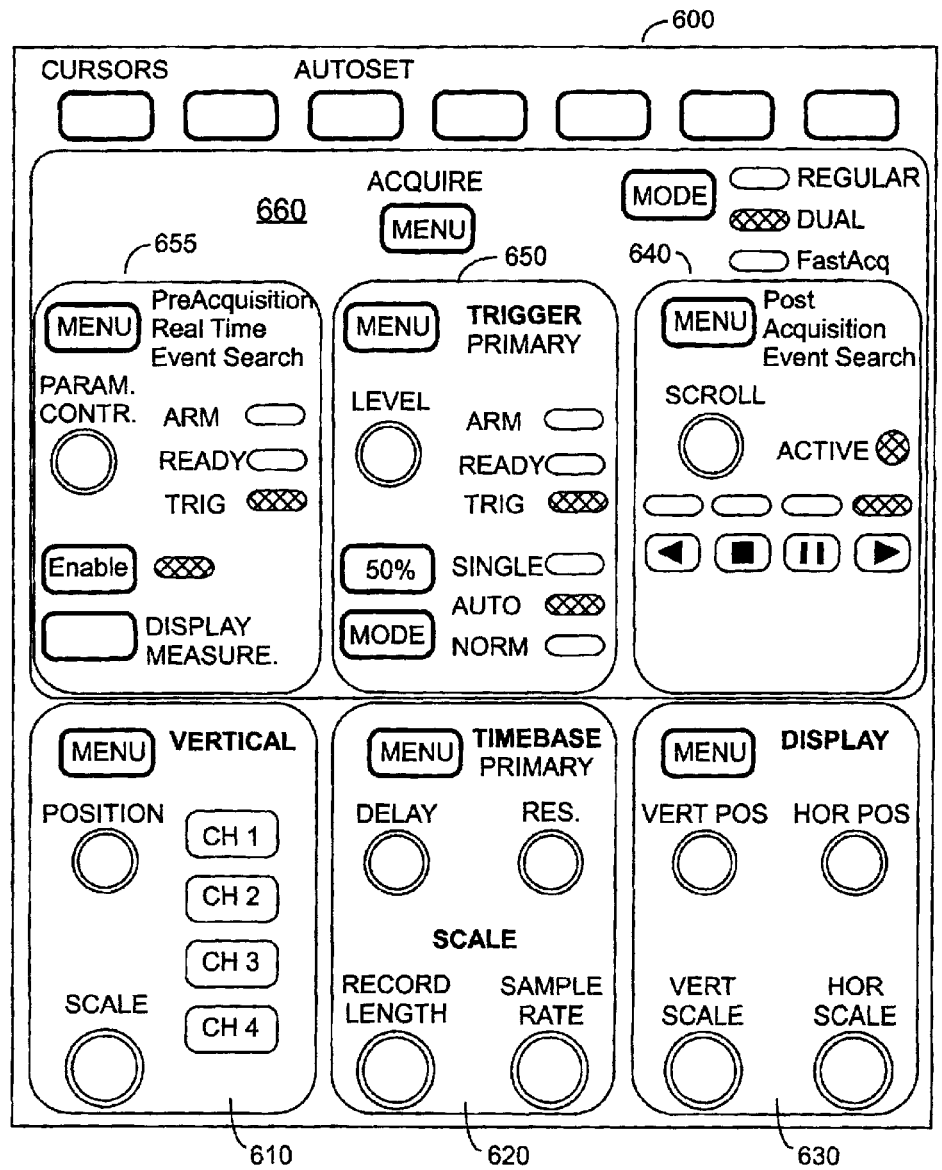
FIG. 6 shows a front panel arrangement of digital storage oscilloscope suitable for use with the invention.

FIG. 6 shows a front panel 600 for an oscilloscope having controls suitable for use with the subject invention. The oscilloscope controls are arranged in functional groups 610, 620, 630, 640, 650, and 655. Functional groups 640, 650, and 655 are arranged together in a further functional group 660. Front panel 600 includes standard control buttons such as CURSORS and AUTOSET and other control knobs that will not be described in detail. Functional group 610 includes controls for menu selection, for selecting a channel, and for adjusting the scale and position of the displayed signal waveform. Functional group 620 controls the timebase aspects of the signal to be acquired, such as Delay, Resolution, Record Length, and Sample Rate. Functional group 630 controls the Display and includes controls for Horizontal Position, Vertical Position, Vertical Scale and Horizontal Scale.

Functional group 660 includes Functional groups 640, 650, and 655 and also a set of controls for controlling how the oscilloscope is to acquire the waveform samples of the signal under test. Specifically, a button is provided for displaying an Acquire menu on the display screen of the oscilloscope. A second button, labelled MODE, selects among REGULAR MODE, DUAL MODE, AND FastAcq MODE. An indicator located next to each of these legends is illuminated to show which mode is selected. The illuminated indicator is depicted in FIG. 6 by a crosshatched pattern. When an operator wants to acquire a long length data record for Post Acquisition Search for Secondary Trigger Events, he selects DUAL MODE. In this mode the primary data acquisition record length is set to maximum, and the Post Acquisition Record length (Frame size) is set by the Record Length control of Functional group 620. It is envisioned that in addition to an "on-the-fly" real-time detection of predetermined events, the subject invention can also "loop through" the acquired long data record in a post acquisition mode of operation. Functional Group 640 controls the Post Acquisition Event Search and includes a MENU button for displaying a menu including a list of trigger event criteria. Note that "replay" of the long length data record is controlled by pushbutton controls that are similar in form and function to the controls of a VCR. In functional group 640, indicators are illuminated to show that a Post Acquisition Event Search is active, and that the long record length data is being played in a forward direction. Functional group 640 also includes a scroll knob for manually scrolling through a paused long record length waveform from one event to the next. Functional group 650 contains standard triggering controls and indicators.

Functional Group 655 contains controls and indicators for use with real time detection of anomalous events in accordance with the subject invention. Functional Group 655 controls the Pre-Acquisition Real-Time Event Search and includes a MENU button for displaying a menu including a list of trigger event criteria. In functional group 655, an indicator is illuminated to show that a Pre-Acquisition Event Search is enabled. Functional group 655 also includes a Parameter Control Knob. The Parameter Control Knob is intended to be "attached" (i.e., associated with) a given selected parameter for controlling variable characteristics of that parameter. For example, trigger on a pulse width less than a predetermined amount, or trigger on a rise time slower than a predetermined amount.

It is important to note that the Pre-Acquisition Real Time Event Search capability allows real time measurements on a signal-under-test as it is being received, and provides display of the event independently of the acquisition of the waveform containing the event, and accomplishes these features without interrupting further measurements. In addition to providing for triggering in response to measured events, it also enables triggering from statistical data, for example, in histograms. In this regard, one may choose to display only the first occurrence of an anomaly and record subsequent occurrences in a histogram. Moreover, one may program a sequence of events that will initiate a trigger only when the predefined sequence occurs. This predefined event detection sequence may be programmed to occur in one channel or across a number of channels.

The measurement algorithms of apparatus according the subject invention are intended to be optimized such that, the oscilloscope is capable of missing substantially no events. In fact, measurements may be made, and an extensive histogram of events built, without encountering a point at which a trigger signal is generated at all. In such a case the system processor may simply be periodically reading and displaying a graph of the histogram, for example. In this example, the Event was recognized and the histogram updated, but no corresponding Event Detect (i.e., trigger) signal need be programmed to occur.

Figure 7:
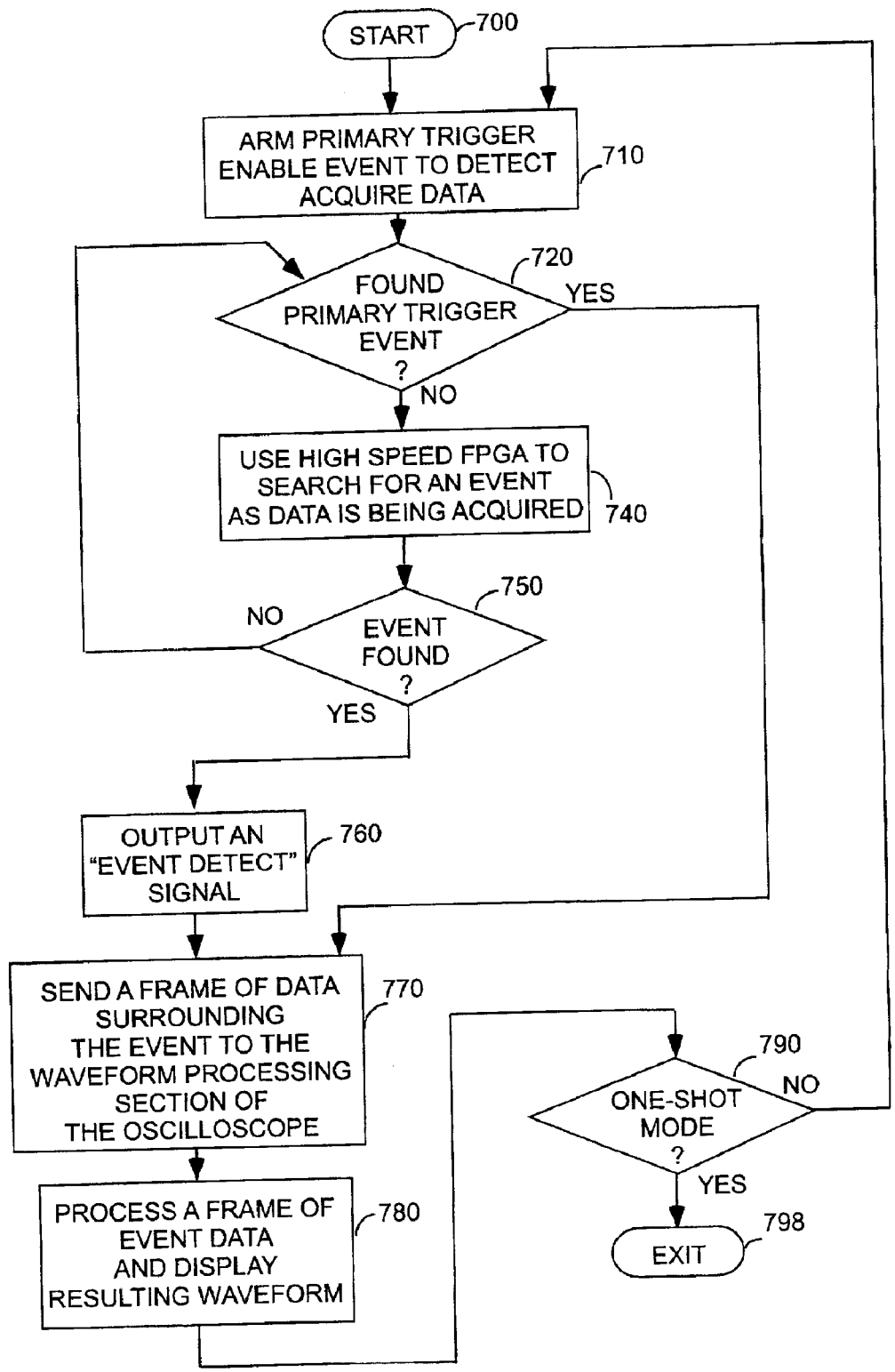
FIG. 7 is a simplified flowchart showing a Primary Acquisition and Real-Time Event Search routine, in accordance with the subject invention.

FIG. 7 is a simplified flowchart showing a Primary Acquisition and Real-Time Event Search routine. The routine is entered at location 700 and advances to block 710 wherein the oscilloscope acquires data samples using standard criteria for primary triggering and also examines the received data in accordance with predetermined event data. Steps 720 and 740, taken together, illustrate the OR-function triggering referred-to above. Step 720 is performed in Trigger ASIC 520 wherein a check is made to see if the currently received signal corresponds to the selected type of trigger condition (as known from the prior art). If a trigger is recognized, the YES path is taken, and Trigger ASIC 520 controls DEMUX units 541, 542, 543, 544 to acquire a short data record (a frame of data) encompassing the analog trigger event and send it for processing and display (Step 760).

Step 740 is reached directly from step 720 if no primary trigger condition was detected in step 720. In step 740, the currently received data is examined by Processor unit 561, 562, 563, 564 (preferably a high speed FPGA), in real-time as it is being stored in acquisition memory, to detect the occurrence of a predetermined event, or sequence of events. In this regard, note from FIG. 5 that the currently received data is presented to acquisition memory 551, 552, 553, 554, and to Processor unit 561, 562, 563, 564, simultaneously. At step 750, a check is made to see if an event was found. If no event was found, the NO path is followed back to Step 720. If an event of interest was found, then Processor unit 561, 562, 563, 564 generates an "Event Detect" signal, which is applied to Trigger ASIC 520 via OR-gate 522. Thus, oscilloscope triggering can be accomplished via detection of standard analog trigger conditions, or by detection of events (anomalies) in the received data, or by a combination of both. As noted, an OR-gate 522 was shown for simplicity, but in fact, this logic may be far more complex and, powerful. For example, it may itself be a controller programmed to detect a sequence of predetermined anomalous events across multiple channels.

At step 770, a frame of data surrounding the event of interest is sent to the waveform processing section of the oscilloscope. At step 780, the frame of Event data is processed and the resulting waveform is displayed. A check is made at step 790 to see if the oscilloscope is in One-shot mode, or in Free-Run (sometimes called AutoRun) mode. If in One-Shot acquisition mode, no new data should be acquired, so the YES path is followed to step 798 and the routine is exited. If in Free-Run mode, a new acquisition will be performed, so the routine loops back to step 710 to acquire a new record. In Free Run mode, the display will appear lively and responsive, due to the continuous updating of the record, and because the user can change the search criteria and immediately see a change on the display. For instance, the operator may have set the Search Event to be a Runt signal event (i.e., a detection of a pulse whose amplitude did not reach a switching threshold before returning to its original state). During the search the operator may change his mind and wish to search for a pulse having an out-of-tolerance pulse width. Immediately upon adjusting the search criteria, the displayed waveform will reflect the result of the new choice of event. That is, event types may be changed on-the-fly as the data is being acquired.

Figure 8:
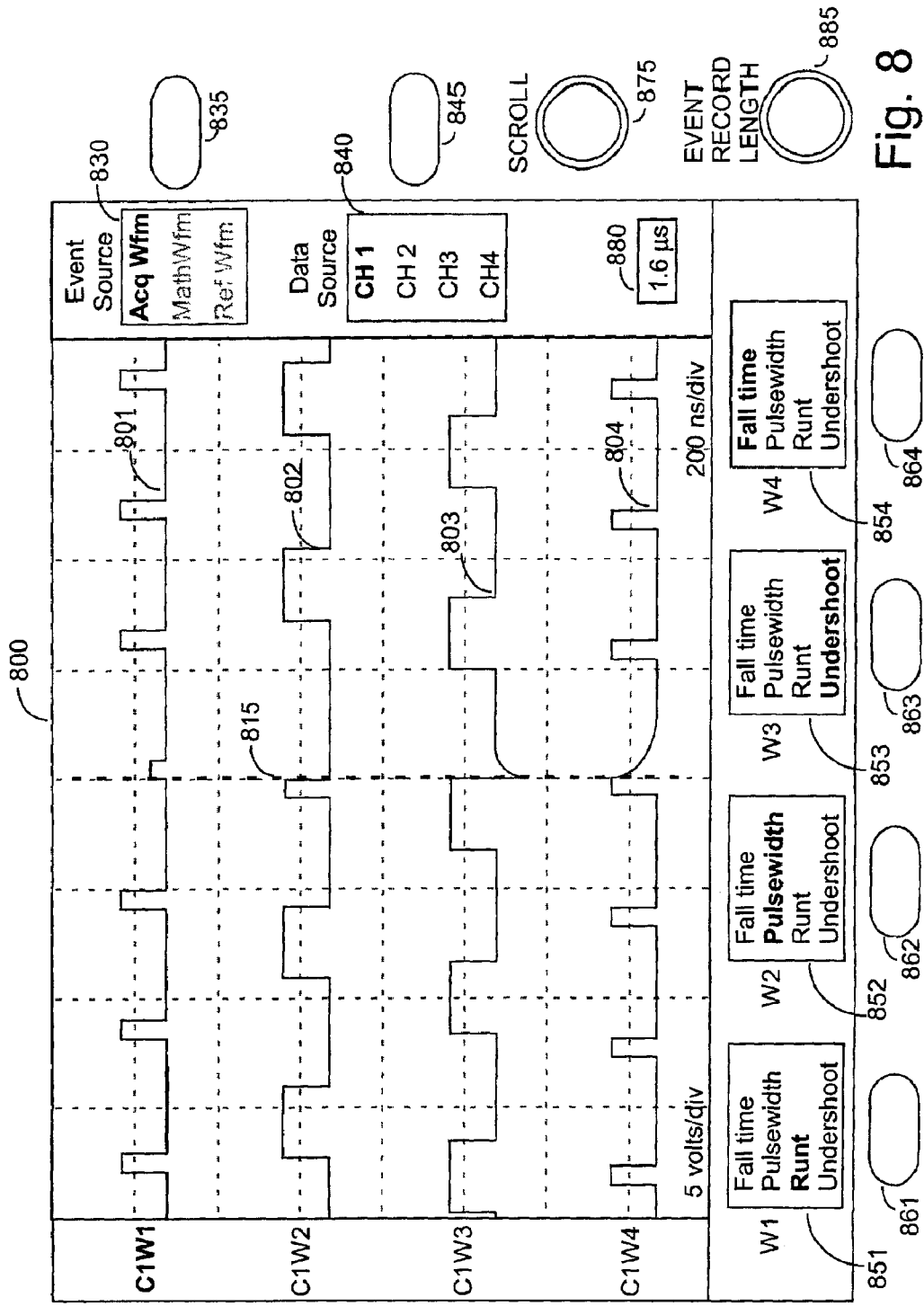
FIG. 8 is an illustration of a screen display in accordance with a first aspect of the subject invention.

FIG. 8 is an illustration of a screen display produced in accordance with the subject invention. A display screen 800 of a digital storage oscilloscope is shown displaying four waveforms 801, 802, 803, 804. Each waveform is exhibiting an anomaly that was detected and time-stamped by apparatus according to the subject invention. An EVENT SOURCE menu 830 allows selection of the source waveform that will be searched for anomalies. The menu choices are selected in sequence by repeated pressing of a pushbutton 835. In this case, the Acq Wfm choice is highlighted to indicate that a waveform currently being acquired has been selected to be the source waveform. Other choices of a Math Waveform (MathWfm), or a reference waveform (RefWfm) are grayed to show that they are not selectable in real time mode. Because AcqWfm was selected, the next choice is that of the data channel, in this case, Chan 1 has been highlighted to indicate its selection. As the data record is being acquired, the data is searched in real time for anomalies in an operation involving detection of the various anomalies and time-stamping their respective locations in memory.

While in this example four waveforms are displayed, one skilled in the art will recognize that the invention is extendible to more than four. Each of the four waveforms W1, W2, W3, W4 is controlled to display an anomaly (i.e., Event) chosen from a respective event menu 851, 852, 853, 854, by repeatedly pressing an associated pushbutton 861, 862, 863, 864. In this case, W1 displays examples of Runt signals, W2 displays examples of Pulsewidth violations, W3 displays examples of Undershoot conditions, and W4 displays examples of Fall time violations. Processor unit 561, 562, 563, 564 causes short record length waveforms 801, 802, 803, 804 to be sent for display, in response to the detection of preselected anomalies (i.e., Events).

The legend displayed to the left of the waveform 801 indicates the source C1 (channel 1), and the selected kind of anomaly W1. That is waveform 801 is displaying an occurrence of a runt signal. Similarly, each of waveforms 802, 803, 804 is displaying an occurrence of its respective kind of selected anomaly.

SCROLL KNOB 875 is used in a post acquisition search mode of operation wherein one replays and can scroll through a stored long data record. Briefly, selecting a waveform (for example, by physically touching the waveform on a touch-sensitive screen) logically connects the SCROLL knob 875 to that waveform. Thereafter, rotating the SCROLL knob 875 causes the waveform to jump to a display of the next example of that kind of event, wherever it occurs in the long data record.

Figure 9:
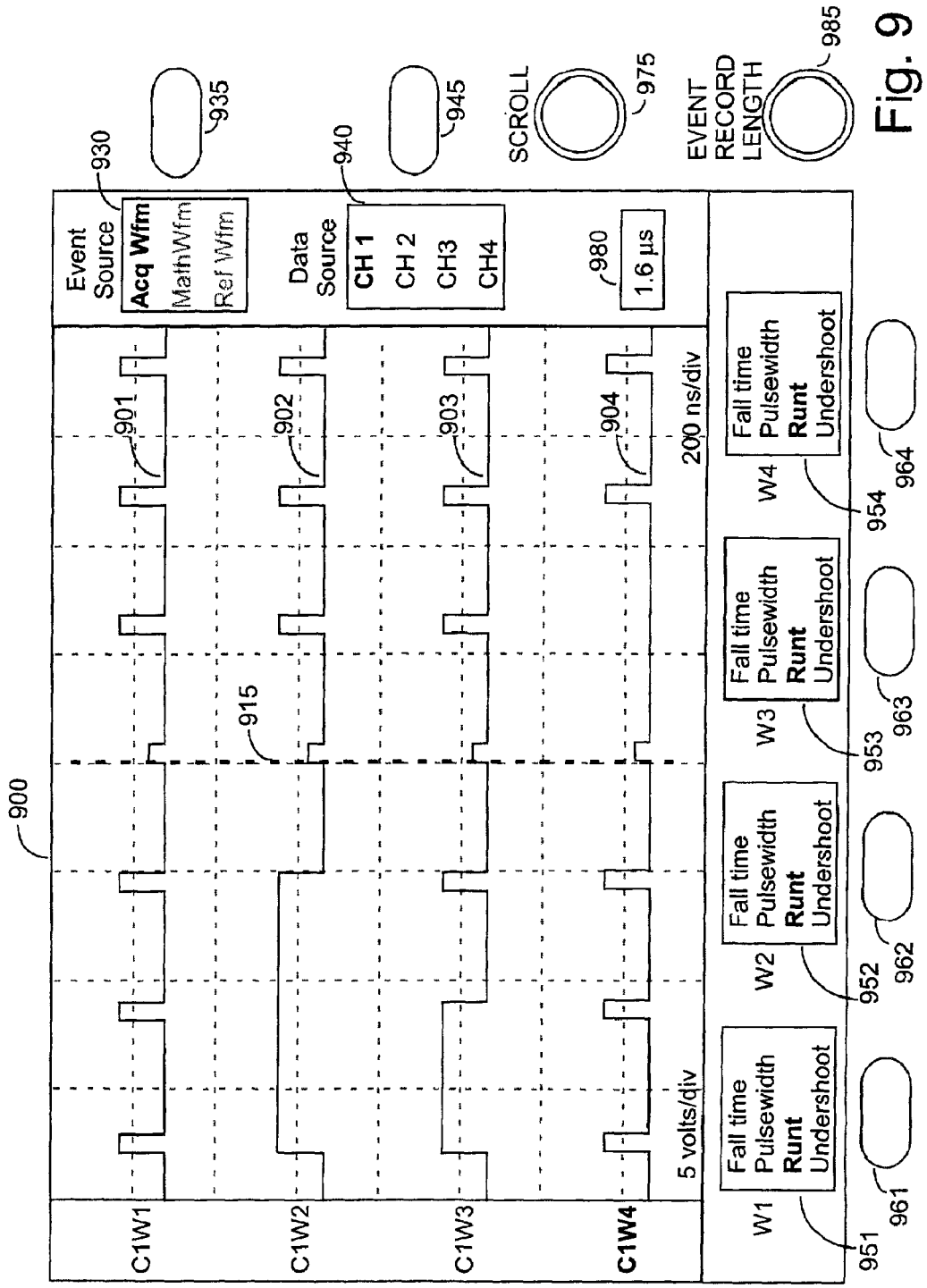
FIG. 9 is an illustration of a screen display in accordance with a second aspect of the subject invention.

While the operation of apparatus of the invention with respect to FIG. 8 is quite useful, one may wish to view all occurrences of single anomaly within the data record. The screen display of FIG. 9 provides an easy way to accomplish this goal. The majority of the elements of FIG. 9 are identical to similarly numbered elements of FIG. 8, and need not be described again. Event selection menus 951, 952, 953, 954 are used to program all of waveforms W1, W2, W3, W4 to display the same kind of event, in this case a Runt signal. Note that waveform W2 is labelled C1W2 to indicate that it is displaying a runt signal, waveform W3 is labelled C1W3 to indicate that it is displaying a runt signal, and waveform W4 is labelled C1W4 to indicate that it too is displaying a runt signal.

Some examples of Pre-Acquisition Trigger Search Events are:

Jitter (width, rise, edge, etc.)

| | |
|---|---|
| Edge | High |
| Pulse width | Low |
| Pulse amplitude | Min |
| Rise time | Max |
| Telecom serial pattern | RMS |
| Telecom packet recognition | Overshoot + − |
| Wave Shape (matched filter) | Histogram, stdev, mean, pk-pk |
| Runt | Eye Diagrams and mask triggers |
| Waveform Comparisons | Limits masks |
| Peak-to-peak | Frequency |
| Period | |

One skilled in the art will appreciate that this list does not include all possible events (anomalous conditions), and the scope of the following claims is intended to be broad enough to include those events not specifically recited.

The term DUAL MODE has been used in describing the mode of operation of the subject invention. Use of this term is not critical to the practicing of the subject invention, nor is this term is to be considered limiting in any way.

The subject acquisition system is capable of maintaining the data of an entire long record in memory, thus preserving the timestamps of the data to allow post processing jitter analysis to be performed, if desired.

Throughout the specification the terms "event" and "anomaly" have been used interchangeably to indicate a point of interest in the data record.

The use of Processing unit in each channel permits simultaneous triggering on different criteria in each channel thus permitting simultaneous display of waveforms relating to each trigger.

One skilled in the art will recognize that a given processing unit may be programmed to recognize more than one kind of anomalous event.

While the four Processing units 561, 562, 563, 564 have been described as preferably being FPGAs, one skilled in the art will understand that use of a microcomputer in this role will also work in an acceptable manner, but the speed advantage of the FPGA will not be realized. Therefore the use of a microcomputer, ASIC, or other processor unit is considered to be within the scope of the invention and covered by the following claims.

What is claimed is:

1. An acquisition system for a digital storage oscilloscope comprising:

an input terminal for receiving a signal under test;

an analog-to-digital converter having an input coupled to said input terminal for receiving said signal under test and for producing digital samples of said signal under test at an output;

a trigger circuit having an input coupled to said input terminal for receiving said signal under test to produce a first trigger signal at an output of the trigger circuit in response to detection of a first predetermined trigger event in said signal under test;

an acquisition memory having an input for receiving and storing said digital samples of said signal under test in a data record; and processor circuitry having an input coupled to said input of said acquisition memory for receiving and examining said digital samples in a real-time mode of operation and for producing an EVENT DETECT signal in response to detection of a predetermined anomalous event in said digital samples to cause a predetermined amount of said digital samples to be sent to a signal processing portion of said oscilloscope for processing and display, said predetermined amount being related in time to said predetermined anomalous event.

2. The acquisition system of claim 1 wherein:

said processor circuitry operates in one of a one-shot mode and an autorun mode;

in said one-shot mode, said processor circuitry repeatedly examines a single data record;

in said autorun mode, said processor circuitry causes the acquisition of a new data record upon completion of examination of a currently stored data record.

3. The acquisition system of claim 2 wherein:

data representative of said predetermined anomalous event is input to said processor circuitry by a user for causing said processor circuitry to produce said EVENT DETECT signal upon detection of said predetermined anomalous event.

4. The acquisition system of claim 3 wherein:

said data representative of said predetermined anomalous event can be changed by said user as said data record is being acquired.

5. The acquisition system of claim 4 wherein:

said predetermined amount of digital samples represents a frame of samples surrounding said predetermined anomalous event, and a magnitude of said predetermined amount of digital samples is controllable by said user.

6. The acquisition system of claim 5 wherein said oscilloscope has multiple channels:

each of said channels having a respective processor and a memory associated therewith.

7. The acquisition system of claim 6 wherein:

each of said respective processors can be programmed to detect a plurality of different anomalous events; and waveforms representative of data surrounding each of said different anomalous events are simultaneously displayed on a display screen of said oscilloscope.

8. The acquisition system of claim 7 wherein:

said trigger circuit receives said EVENT DETECT signal; and said trigger circuit responds to traditional analog-type trigger signals or to said detection of said predetermined anomalous event, or to a combination of both.

9. The acquisition system of claim 8 wherein:

said processor circuitry can be programmed to detect a sequence of a plurality of different events; and waveforms representative of anomalous data are displayed on a display screen of said oscilloscope in response to said detection of said sequence.

10. The acquisition system of claim 8 wherein:

said processor circuitry can be programmed to trigger on statistical data representing a histogram of the occurrence of a plurality of anomalous events; and waveforms representative of anomalous data are displayed on a display screen of said oscilloscope in response to said triggering on said statistical data.

11. The acquisition system of claim 8 wherein said processor circuitry is an FPGA.

12. The acquisition system of claim 8 wherein said processor circuitry is a microcomputer.

13. The acquisition system of claim 8 wherein said processor circuitry is an ASIC.

* * * * *